United States Patent
Kim et al.

(10) Patent No.: US 11,715,851 B2
(45) Date of Patent: Aug. 1, 2023

(54) BATTERY MODULE AND VEHICLE INCLUDING THE SAME

(71) Applicant: SAMSUNG SDI CO., LTD., Yongin-si (KR)

(72) Inventors: Junseop Kim, Yongin-si (KR); Woongbin Kim, Yongin-si (KR); Yujeong Jeon, Yongin-si (KR); Kum-Yul Hwang, Yongin-si (KR); Kwan Il Oh, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 116 days.

(21) Appl. No.: 17/346,418

(22) Filed: Jun. 14, 2021

(65) Prior Publication Data

US 2021/0399363 A1 Dec. 23, 2021

(30) Foreign Application Priority Data

Jun. 17, 2020 (KR) .................. 10-2020-0073856
Mar. 25, 2021 (KR) .................. 10-2021-0038928
Jun. 9, 2021 (KR) .................. 10-2021-0074909

(51) Int. Cl.
*H01M 10/6572* (2014.01)
*H01L 35/10* (2006.01)
*H01L 35/34* (2006.01)
*H05K 7/20* (2006.01)
*H05K 1/02* (2006.01)
(Continued)

(52) U.S. Cl.
CPC ..... *H01M 10/6572* (2015.04); *H01M 10/613* (2015.04); *H01M 10/615* (2015.04); *H01M 10/643* (2015.04); *H01M 10/653* (2015.04); *H01M 10/667* (2015.04); *H05K 1/0203* (2013.01); *H05K 7/2039* (2013.01);
(Continued)

(58) Field of Classification Search
CPC .......... H01M 10/6572; H01M 10/613; H01M 10/615; H01M 10/643; H01M 10/653; H01M 10/667; H01M 2220/20; H01M 10/625; H05K 1/0203; H05K 7/2039; H05K 2201/10037; H05K 2201/09409; H05K 2201/10219; H05K 1/184; H10N 10/01; H10N 10/82; Y02E 60/10
See application file for complete search history.

(56) References Cited

U.S. PATENT DOCUMENTS

2006/0060236 A1 3/2006 Kim
2010/0098974 A1* 4/2010 Kim ................. H01M 50/15
361/103

(Continued)

FOREIGN PATENT DOCUMENTS

JP 2009152440 A * 7/2009 ............ Y02E 60/10
JP 5305081 B2 10/2013
(Continued)

*Primary Examiner* — Kaity V Chandler

(74) *Attorney, Agent, or Firm* — Lee IP Law, P.C.

(57) ABSTRACT

A battery module, a vehicle, and a method of manufacturing a battery module, the battery module including a housing accommodating a plurality of secondary batteries; and a thermoelectric element assembly on the housing and in contact with the plurality of secondary batteries through at (Continued)

least one contact opening in the housing, the thermoelectric element assembly being configured to heat or cool the plurality of secondary batteries.

30 Claims, 16 Drawing Sheets

(51) Int. Cl.
*H01M 10/613* (2014.01)
*H01M 10/615* (2014.01)
*H01M 10/653* (2014.01)
*H01M 10/643* (2014.01)
*H01M 10/667* (2014.01)
*H10N 10/01* (2023.01)
*H10N 10/82* (2023.01)

(52) U.S. Cl.
CPC ............ *H10N 10/01* (2023.02); *H10N 10/82* (2023.02); *H01M 2220/20* (2013.01); *H05K 2201/10037* (2013.01)

(56) References Cited

U.S. PATENT DOCUMENTS

| | | | |
|---|---|---|---|
| 2010/0136392 A1* | 6/2010 | Pulliam | H01M 10/486 429/90 |
| 2010/0207573 A1* | 8/2010 | Mo | F21V 13/14 320/101 |
| 2015/0280099 A1* | 10/2015 | Boukai | H10N 10/17 438/54 |
| 2017/0170533 A1 | 6/2017 | Choi et al. | |
| 2019/0296273 A1* | 9/2019 | Tang | H01M 50/536 |
| 2019/0356029 A1* | 11/2019 | Chen | H01M 10/441 |

FOREIGN PATENT DOCUMENTS

| | | | | |
|---|---|---|---|---|
| KR | 10-2006-0027578 A | 3/2006 | | |
| KR | 10-1715697 B1 | 3/2017 | | |
| KR | 10-1734717 B1 | 5/2017 | | |
| WO | WO-2016021893 A1 * | 2/2016 | | H01L 35/02 |
| WO | WO-2017122690 A1 * | 7/2017 | | H01M 10/613 |
| WO | WO-2017201083 A2 * | 11/2017 | | B60N 2/56 |
| WO | WO-2021045376 A1 * | 3/2021 | | H01M 10/44 |

\* cited by examiner

BATTERY MODULE AND VEHICLE INCLUDING THE SAME

CROSS-REFERENCE TO RELATED APPLICATION

Korean Patent Application No. 10-2020-0073856, filed on Jun. 17, 2020 in the Korean Intellectual Property Office, Korean Patent Application No. 10-2021-0038928, filed on Mar. 25, 2021 in the Korean Intellectual Property Office, Korean Patent Application No. 10-2021-0074909, filed on Jun. 9, 2021 in the Korean Intellectual Property Office, all entitled: "Battery Module and Vehicle Including the Same," are incorporated by reference herein in their entirety.

BACKGROUND

1. Field

Embodiments relate to a battery module and a vehicle including the same.

2. Description of the Related Art

A rechargeable or secondary battery differs from a primary battery in that charging and discharging may be repeated and the latter provides only non-reversible conversion from a chemical material into electrical energy. A low-capacity rechargeable battery may be used as a power source of a small electronic device such as a mobile phone, a laptop computer, or a camcorder, and a high-capacity rechargeable battery may be used as a power source for, e.g., a hybrid vehicle or the like.

The secondary battery may include a battery module by combining a plurality of cells in series or in parallel to provide high energy density for driving, e.g., a vehicle. The battery module may include a plurality of secondary batteries embedded in an inner space of a module housing and a cover assembly may be coupled to the module housing.

SUMMARY

The embodiments may be realized by providing a battery module including a housing accommodating a plurality of secondary batteries; and a thermoelectric element assembly on the housing and in contact with the plurality of secondary batteries through at least one contact opening in the housing, the thermoelectric element assembly being configured to heat or cool the plurality of secondary batteries.

The at least one contact opening may include a plurality of contact openings in the housing, and the thermoelectric element assembly may be respectively in contact with the plurality of secondary batteries through the plurality of contact openings.

The thermoelectric element assembly may include a printed circuit board on the housing and including a plurality of installation openings aligned with the plurality of contact openings; and a plurality of thermoelectric elements respectively in the plurality of installation openings and electrically connected to the printed circuit board.

The plurality of thermoelectric elements may be in contact in a one-to-one correspondence with the plurality of secondary batteries.

One thermoelectric element of the plurality of thermoelectric elements along an edge of the housing may be in contact with at least two secondary batteries of the plurality of secondary batteries, and other thermoelectric elements of the plurality of thermoelectric elements may be in contact with other secondary batteries of the plurality of secondary batteries in a one-to-one correspondence.

The housing may further include a stopper adjacent to the plurality of thermoelectric elements, the stopper being configured to prevent movement of the printed circuit board.

The printed circuit board may further include an insertion groove, and the stopper may include at least one rib protruding from a surface of the housing and into the insertion groove of the printed circuit board.

Each thermoelectric element of the plurality of thermoelectric elements may include an electrically conductive first plate in contact with one secondary battery of the plurality of secondary batteries; an electrically conductive second plate having a larger area than that of each contact opening and spaced apart from the first plate; and a semiconductor between the first plate and the second plate and electrically connected to the first plate and the second plate.

The first plate may further include a fitting groove, the housing may further include a coupling protrusion, and the coupling protrusion may fit into and be coupled with the fitting groove.

The battery module may further include a buffer member on one side of the thermoelectric element assembly, the buffer member being configured to protect the thermoelectric element assembly.

The buffer member may include a thermal pad on the thermoelectric element assembly corresponding to each secondary battery of the plurality of secondary batteries.

The battery module may further include a heat sink on the housing at one side of the buffer member.

The battery module may further include a coupling case on the heat sink and fixed to the housing.

Each secondary battery of the plurality of secondary batteries may include a can in which an electrode assembly is accommodated, and a cap assembly coupled to an opening of the can, and the thermoelectric element assembly may be in contact with a bottom of the can of each secondary battery of the plurality of secondary batteries.

Each secondary battery of the plurality of secondary batteries may be cylindrical.

The battery module may further include at least one dummy pattern between the printed circuit board and each thermoelectric element of the plurality of thermoelectric elements, the at least one dummy pattern having a height corresponding to a height of an electrical connector between the thermoelectric element and the printed circuit board.

Each thermoelectric element of the plurality of thermoelectric elements may include an electrically conductive first plate in contact with one secondary battery of the plurality of secondary batteries; an electrically conductive second plate with a larger area than that of each contact opening and spaced apart from the first plate; a plurality of semiconductors between the first plate and the second plate and electrically connected to the first plate and the second plate; and a semiconductor terminal on the second plate, extending from an outermost semiconductor among the plurality of semiconductors, and electrically connected to a terminal of the printed circuit board, and the at least one dummy pattern may face the electrical connector between the second plate and the printed circuit board.

The at least one dummy pattern may include a plurality of dummy patterns.

A height of the at least one dummy pattern between the thermoelectric element and the printed circuit board may be about the same as the height of the electrical connector between the terminal of the printed circuit board and the semiconductor terminal of the thermoelectric element.

The height of the at least one dummy pattern may be 0.05 mm to 0.25 mm.

The at least one dummy pattern may be formed by soldering.

Each installation opening of the plurality of installation openings may have a rectangular shape, the electrical connector between the thermoelectric element and the printed circuit board may be adjacent to both ends of one edge of the installation opening, and the at least one dummy pattern may be adjacent to a center of another edge facing one side of the installation opening.

Each installation opening of the plurality of installation openings may have a rectangular shape, the electrical connector between the thermoelectric element and the printed circuit board may be adjacent to both ends of one edge of the installation opening, and the at least one dummy pattern may be adjacent to both ends of another edge facing one side of the installation opening.

The first plate may further include a fitting groove, the housing may further include a coupling protrusion, and the coupling protrusion may fit into and be coupled with the fitting groove.

The contact openings and the first plate may each have a rectangular shape, and the coupling protrusion and the fitting groove may each be at a center of one edge of each contact opening and one edge of the first plate.

The contact openings and the first plate may each have a rectangular shape, and at least one corner of the first plate may have a different shape than other corners of the first plate.

The at least one corner of the first plate may have an obliquely cut shape.

The embodiments may be realized by providing a vehicle comprising the battery module according to an embodiment.

The embodiments may be realized by providing a battery module including a housing accommodating a plurality of secondary batteries; and a thermoelectric element assembly on the housing, the thermoelectric element assembly being configured to heat or cool the plurality of secondary batteries at each position by being in contact with the plurality of secondary batteries through a contact opening in the housing.

The embodiments may be realized by providing a method of manufacturing a battery module, the method including preparing a housing in which a plurality of contact openings are formed in a predetermined pattern on a bottom of the housing; preparing a thermoelectric element assembly in which a plurality of thermoelectric elements configured to heat or cool a secondary battery are arranged according to the predetermined pattern of the plurality of contact openings; mounting the thermoelectric element assembly in the housing such that the thermoelectric elements are in the contact openings; and disposing the secondary battery such that the thermoelectric elements are in contact with a surface of the secondary battery in an accommodating space of the housing.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
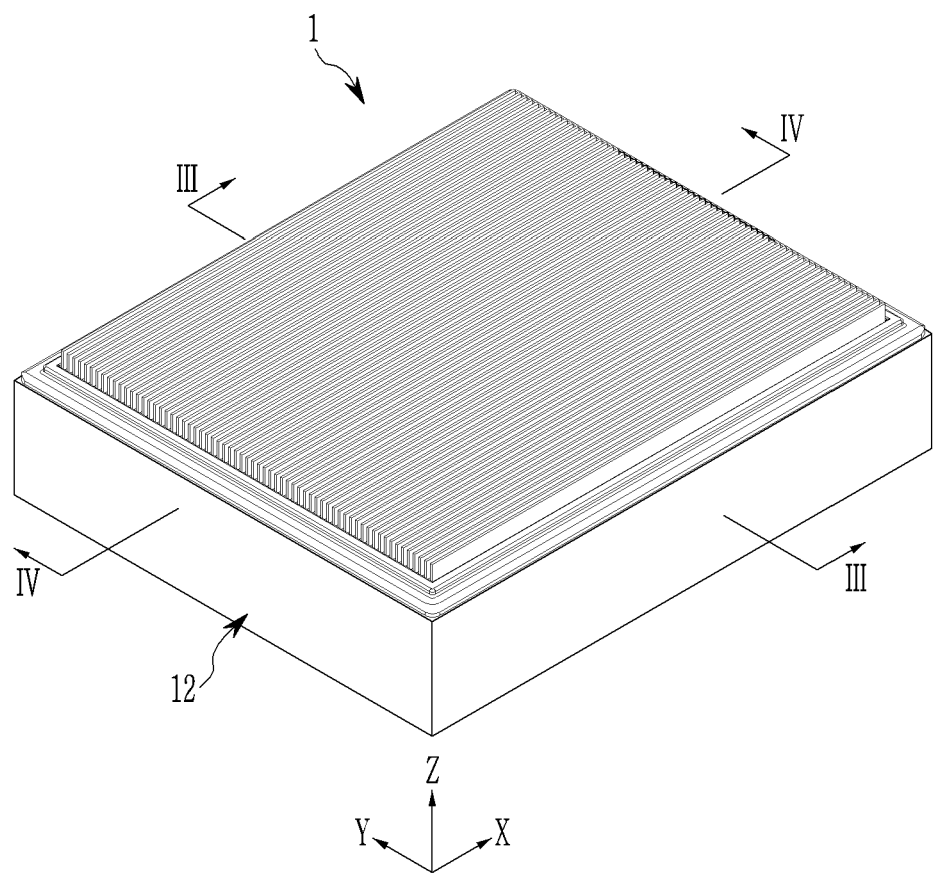
FIG. 1 is a coupling perspective view of a battery module according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being connected or coupled "directly" to another component, it may be connected to or coupled to another component without another component intervening therebetween.

It is also to be understood that the terminology used herein is only for the purpose of describing particular embodiments, and is not intended to be limiting.

Singular forms are to include plural forms unless the context clearly indicates otherwise.

It will be further understood that terms "include," "comprise," "have," or variations thereof used in the present specification specify the presence of stated features, numerals, steps, operations, components, parts, or a combination thereof, but do not preclude the presence or addition of one or more other features, numerals, steps, operations, components, parts, or combinations thereof.

Also, as used herein, the terms "or" and "and/or" include any plurality of combinations of items or any of a plurality of listed items. In this specification, 'A or B' may include 'A', 'B', or 'A and B'.

Figure 2:
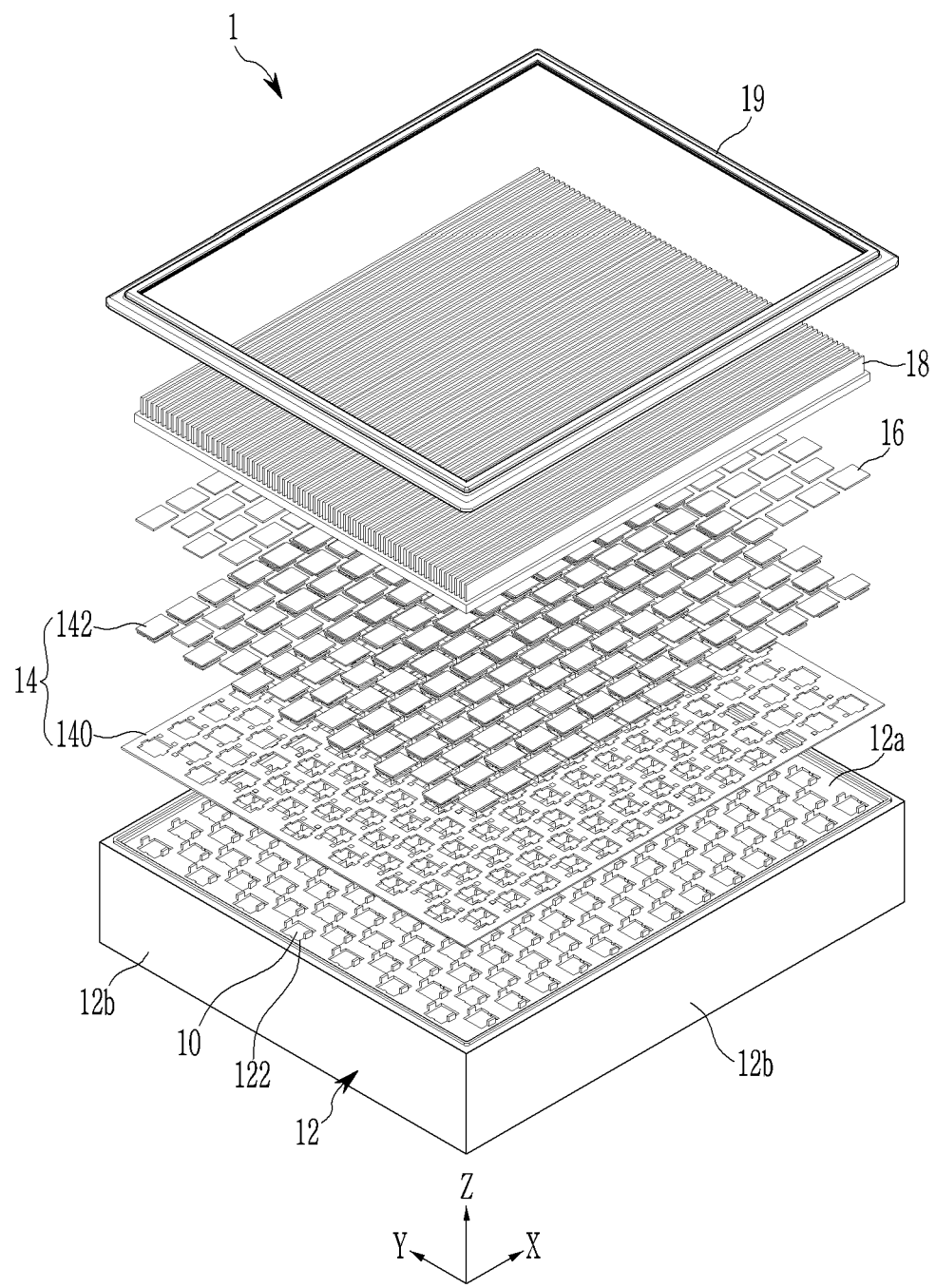
FIG. 2 is an exploded perspective view of a battery module shown in FIG. 1.
Figure 3:
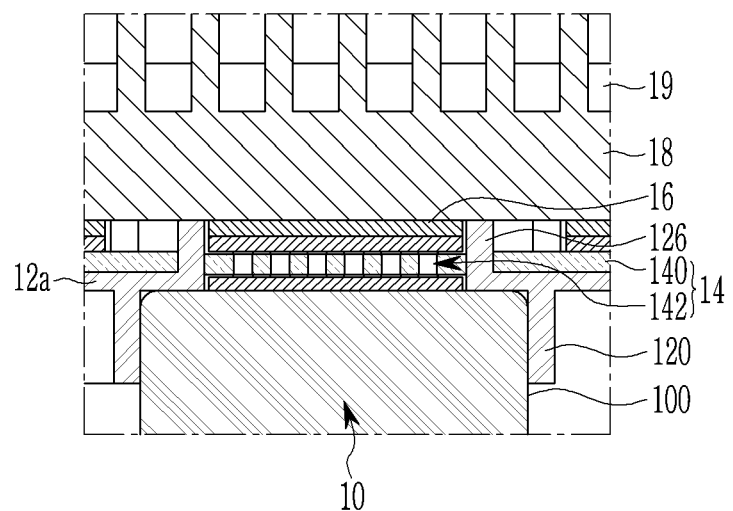
FIG. 3 is a partial cross-sectional view taken along a line of FIG. 1.
Figure 4:
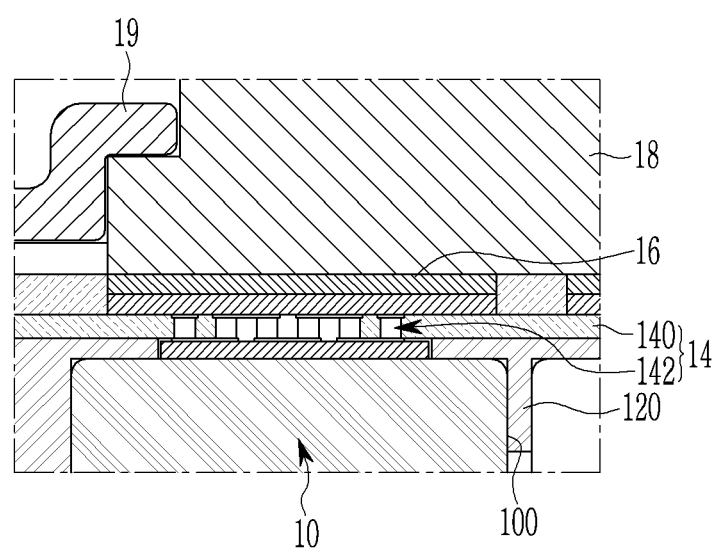
FIG. 4 is a partial cross-sectional view taken along a line IV-IV of FIG. 1.

FIG. 1 is a coupling perspective view of a battery module according to an embodiment, FIG. 2 is an exploded perspective view of a battery module shown in FIG. 1, FIG. 3 is a partial cross-sectional view taken along a line of FIG. 1, and FIG. 4 is a partial cross-sectional view taken along a line IV-IV of FIG. 1.

Referring to the drawings, a battery module 1 according to an embodiment may include a housing 12 in which a plurality of secondary batteries 10 are accommodated in an internal space with a suitable or predetermined pattern. In an implementation, the housing 12 may have a box shape of an approximate quadrangle, and the secondary battery 10 may be a cylindrical secondary battery in the housing 12. In an implementation, the housing may have a circular box shape, and the secondary battery may be a square or pouch secondary battery. In an implementation, the cylindrical secondary battery may be accommodated in a circular box-shaped housing, and the rectangular or pouch secondary battery may be accommodated in the quadrangle box-shaped housing.

The housing 12 may include a quadrangle bottom part 12a having a suitable size and a side part 12b extending from edge of the bottom part 12a. The housing 12 may have a structure of a quadrangle box in which a side facing the bottom part 12a is opened. In FIG. 1 and FIG. 2, the housing 12 is shown in a structure in which the bottom part 12a is on the upper side for convenience (e.g., the housing is inverted). In an implementation, the bottom part 12a of the housing 12 may have a structure that is integrally configured with the side part 12b, e.g., as a one-piece, monolithic unit. In an implementation, the bottom part 12a of the housing 12 may be a separate member from the side part 12b, and may have a structure that is detachably and attachably coupled to the side part 12b.

The secondary battery 10 may be a plurality of secondary batteries, and may be disposed or arranged at a predetermined interval along one (e.g., first) direction X of the housing 12 and another (e.g., second) direction Y perpendicular to the one direction X, inside the housing 12. In an implementation, the secondary batteries 10 that are aligned in odd-numbered columns along the first direction X of the housing 12, may have centers aligned along the second direction Y. In an implementation, the secondary batteries 10 that are aligned in the even-numbered columns, may have centers aligned along the second direction Y. In an implementation, the secondary batteries 10 in the odd-numbered columns and the secondary batteries 10 in the even-numbered columns may be disposed so that their centers are mismatched or offset from each other along the second direction Y (e.g., centers of secondary batteries in adjacent columns may be arranged in a zig-zag pattern along the second direction Y). In an implementation, the secondary batteries 10 may be inside the housing 12 in a mosaic arrangement. In an implementation, the arrangement pattern of the secondary battery 10 may be appropriately changed according to design conditions of the battery module 1.

The secondary batteries 10, e.g., cylindrical secondary batteries, may include an electrode assembly (including a positive electrode, a negative electrode, and a separator) and an electrolyte solution inside a cylindrical can 100, and a cap assembly (electrically connected to the electrode assembly) may be on an opening of the can 100.

On an inner surface of the bottom part 12a of the housing 12, a rib or supporting jaw 120 surrounding and supporting a bottom part of the secondary battery 10 may be included in accordance with the arrangement pattern of the secondary battery 10 described above. The secondary battery 10 may be placed in an accommodating space of the housing 12 by inserting a bottom part of the can 100, e.g., the bottom part of the can 100 facing the cap assembly of the secondary battery 10, into a space formed by the supporting jaw 120. In this way, the secondary battery 10 may be combined or coupled with the housing 12 while being supported by the supporting force by the supporting jaw 120 (referring to FIG. 3).

The bottom part 12a of the housing 12 may include a plurality of contact openings 122 exposing each of the bottom parts of a plurality of the secondary batteries 10. The plurality of contact openings 122 may be arranged in a pattern corresponding to the arrangement pattern of the plurality of secondary batteries 10, and may be in or at the bottom part of the housing 12. In an implementation, the contact openings 122 may have an approximately rectangular shape and may have a suitable size for exposing the bottom part (e.g., the center bottom part) of a corresponding one of the secondary batteries 10.

On the bottom part 12a of the housing 12 (e.g., on the outside of the housing 12), a thermoelectric element assembly 14 (that is electrically connected to a battery management system (BMS)) in contact with the plurality of secondary batteries 10 may be included. The thermoelectric element assembly 14 may be configured to heat or cool the secondary batteries 10 through a direction change of a flow of a current applied from the BMS. In an implementation, the thermoelectric element assembly 14 may include a printed circuit board 140 mounted on the housing 12 (e.g., on or outside the bottom part 12a of the housing 12) and a plurality of thermoelectric elements 142 electrically connected to the printed circuit board 140.

Figure 5:
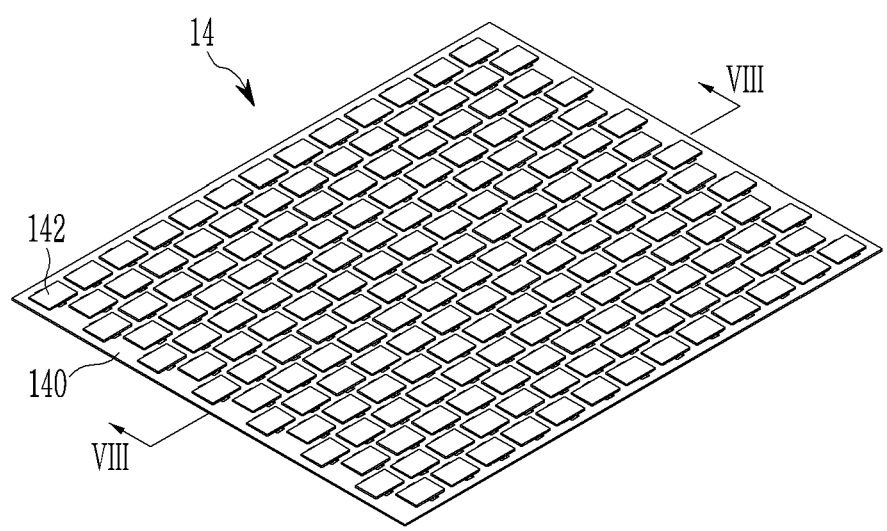
FIG. 5 is a coupling perspective view of a thermoelectric element assembly according to an embodiment.
Figure 6:
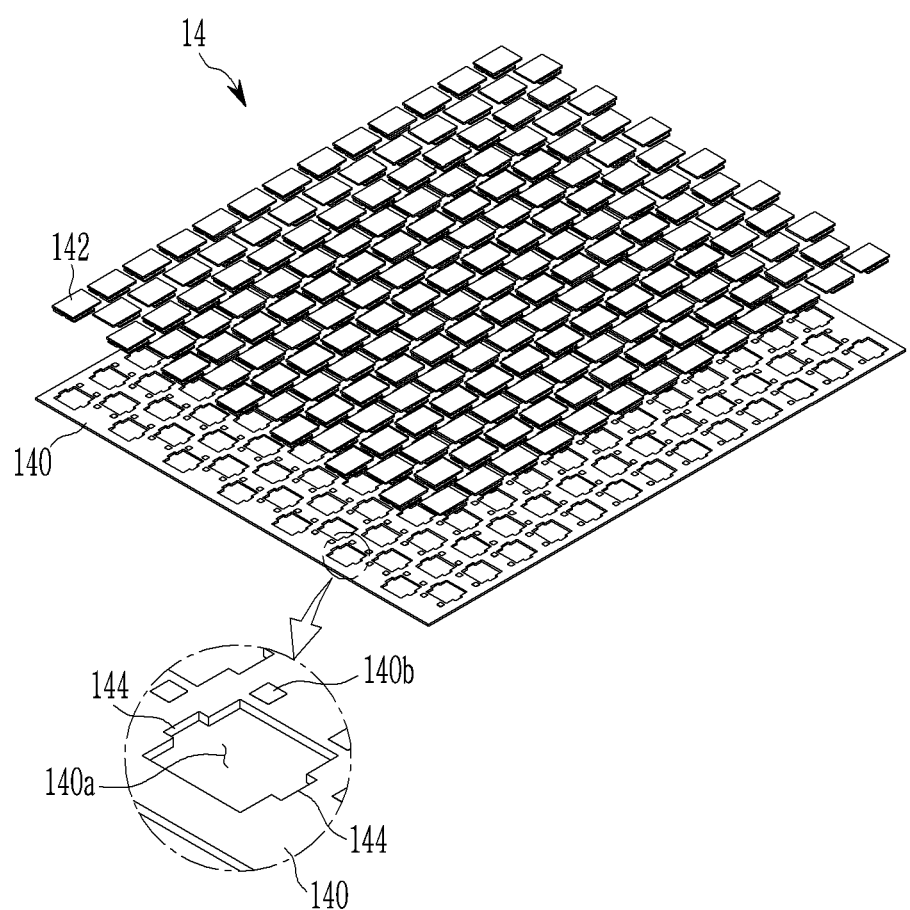
FIG. 6 is a partial perspective view of a thermoelectric element assembly of FIG. 5.

FIG. 5 is a coupling perspective view of a thermoelectric element assembly 14 according to an embodiment, and FIG. 6 is an exploded perspective view of a thermoelectric element assembly 14 according to an embodiment.

Referring to FIG. 2, FIG. 5, and FIG. 6, the printed circuit board 140 may include a plurality of installation openings 140a respectively corresponding to (e.g., overlying or vertically aligned with) the plurality of contact openings 122. In an implementation, the installation opening 140a may also have an approximately rectangular shape, like the contact openings 122. In each installation opening 140a, insertion grooves 144 (into which a stopper to be described below may be inserted) may be arranged opposite to each other along a lengthwise direction of the printed circuit board 140.

The thermoelectric elements 142 of the thermoelectric element assembly 14 may be inserted and coupled to each, e.g., respective, installation opening 140a of the printed circuit board 140, and may be electrically connected to a terminal 140*b* on the printed circuit board 140 through, e.g., soldering or the like.

Figure 7:
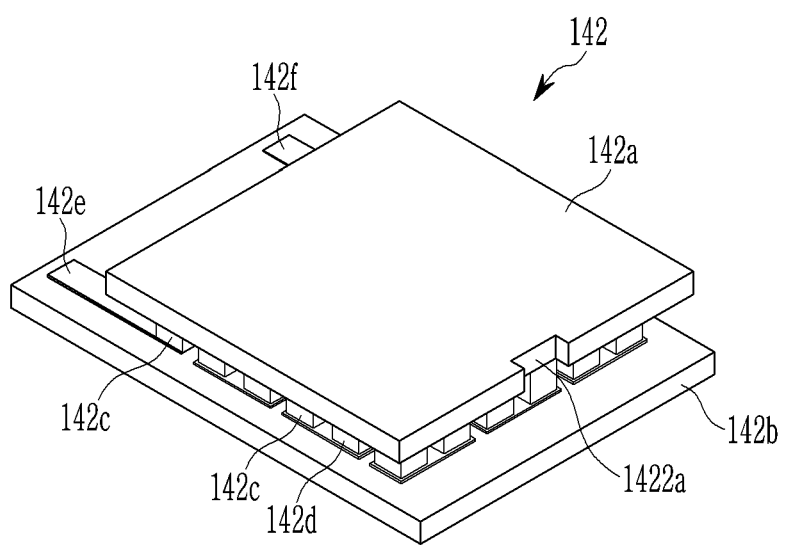
FIG. 7 is a perspective view of a thermoelectric element of a thermoelectric element assembly according to an embodiment.

FIG. 7 is a perspective view of a thermoelectric element 142 according to an embodiment. Referring to FIG. 7, the thermoelectric element 142 may include a quadrangle-shaped first plate 142*a* and second plate 142*b* (each having electric conductivity), and semiconductors 142*c* and 142*d* between the first and second plates 142*a* and 142*b*. The first and second plates 142*a* and 142*b* may be made of, e.g., a ceramic substrate, and the semiconductors 142*c* and 142*d* may be in pairs on a plurality of conductive parts (e.g., metal electrodes such as silver, copper, etc.) on the first and second plates 142*a* and 142*b* in a random or irregular pattern, and may include a P-type semiconductor and an N-type semiconductor electrically connected to the printed circuit board 140 through a conductive line. Among the conductive lines, one conductive line (e.g., a semiconductor terminal to be described below) may be connected to one of a P-type semiconductor and an N-type semiconductor (e.g., a terminal semiconductor to be described below), and another conductive line (e.g., a semiconductor terminal to be described below) may be connected to another semiconductor (e.g., a terminal semiconductor to be described below).

In an implementation, in the thermoelectric element 142, the first plate 142*a* my have a similar size (e.g., area and shape) to that of the installation opening 140*a* and the contact opening 122, and the second plate 142*b* may have a larger size (e.g., area and shape) than that of the installation opening 140*a*.

Figure 8:
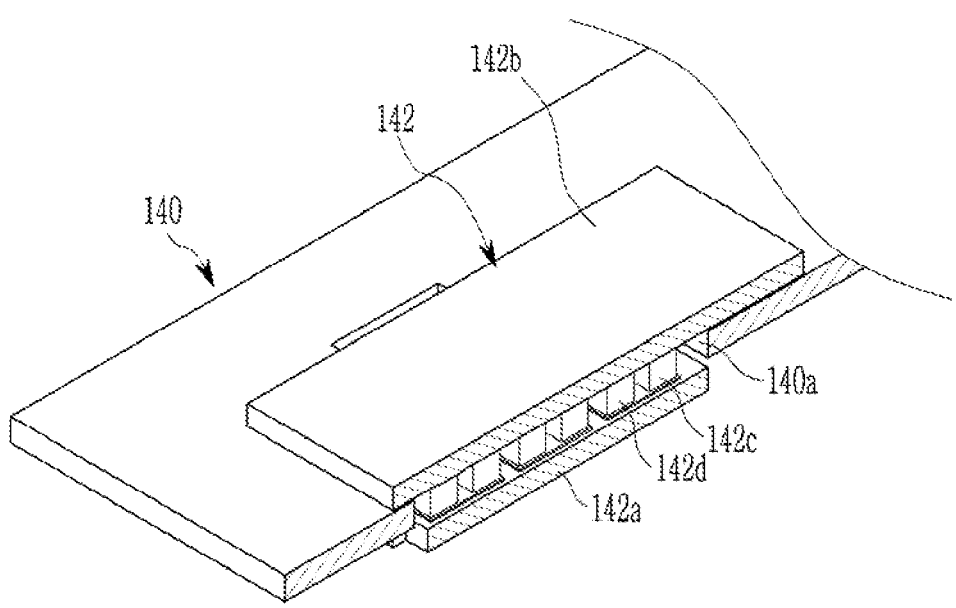
FIG. 8 is a partially cut-away perspective view taken along a line VIII-VIII of FIG. 5.

The thermoelectric element 142, as shown in FIG. 6, in the state that it is in the installation opening 140*a* of the printed circuit board 140, may include the first plate 142*a* in the installation opening 140*a* and may be combined or coupled to the printed circuit board 140 through a surface mounting technology (SMT) for an electrical connection with the printed circuit board 140. In an implementation, the first plate 142*a* may pass through the installation opening 140*a* and may protrude from or beyond one surface of the printed circuit board 140. In an implementation, the second plate 142*b* may have a larger size than the installation opening 140*a*, may not pass through the installation opening 140*a*, and opposite edges thereof (e.g., in the lengthwise direction) may span over or be on the other surface of the printed circuit board 140 (referring to FIG. 8). The coupling structure between the thermoelectric element 142 and the printed circuit board 140 may help prevent the thermoelectric element 142 from sagging downwardly by its own load. In an implementation, the thermoelectric element 142 may continuously maintain a good coupling state with the printed circuit board 140.

In an implementation, the thermoelectric element may have a quadrangle shape due to a quadrangle plate, or the thermoelectric element may be provided in other shapes including a circle. In an implementation, the shape of the installation opening of the printed circuit board may be appropriately changed according to the shape of the thermoelectric element.

In an implementation, the thermoelectric element assembly 14 configured as described above may be mounted and coupled to the housing 12 before the secondary battery 10 is accommodated in the housing 12. In an implementation, the thermoelectric element assembly 14 may be mounted on the outer portion of the bottom part 12*a* of the housing 12 such that a plurality of thermoelectric elements 142 may be inserted into each corresponding contact opening 122 of the housing 12.

When the thermoelectric element 142 is inserted into the contact opening 122, a fitting groove 1422*a* (into which a coupling protrusion 124 of the housing 12 may be fitted) may be at one edge of the first plate 142*a* so that the thermoelectric element 142 may be inserted in a predetermined insertion direction (referring to FIG. 7). In an implementation, the fitting groove 1422*a* may be at a center of the one edge of the first plate 142*a* facing (e.g., toward or away from) the semiconductor terminal 142*e* and 142*f* on the second plate 142*b*. In an implementation, the corresponding terminal semiconductors 142*c* and 142*d* may be electrically connected to the semiconductor terminals 142*e* and 142*f*, respectively.

Figure 9:
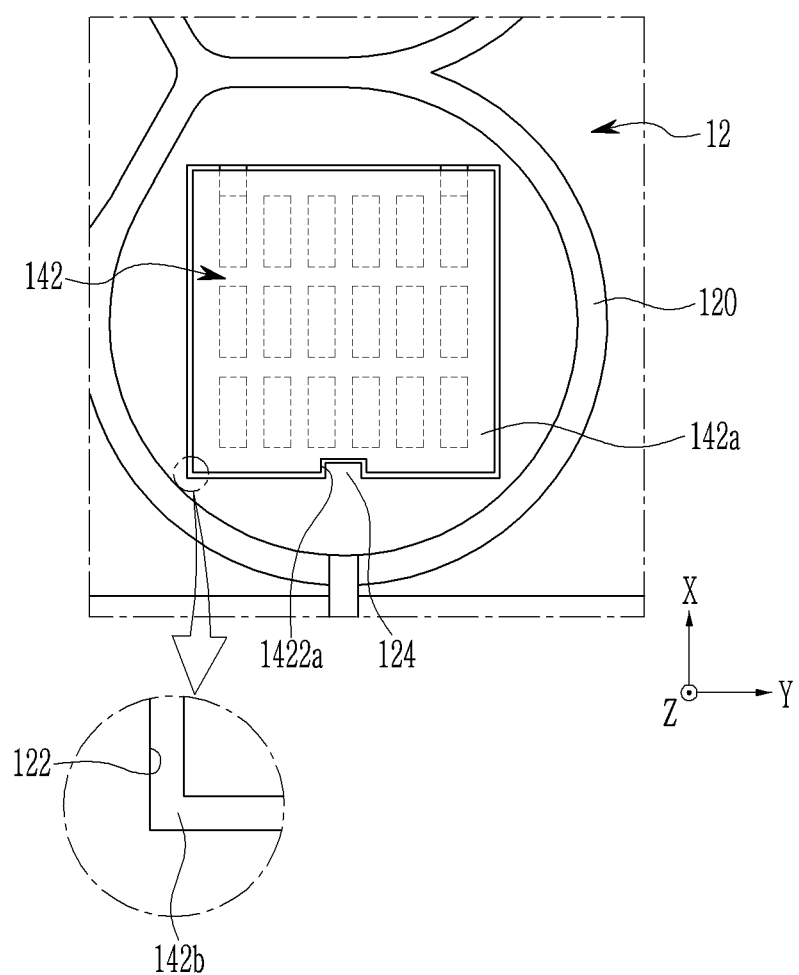
FIG. 9 is a view of a coupling relationship of a thermoelectric element assembly and a housing according to an embodiment.

FIG. 9 shows the thermoelectric element 142 inserted into the contact opening 122 by fitting and coupling the fitting groove 1422*a* of the first plate 142*a* into or onto the coupling protrusion 124 of the housing 12. The coupling of the fitting groove 1422*a* and the coupling protrusion 124 may help prevent reverse insertion (e.g., misalignment) when the thermoelectric element 142 is coupled to the printed circuit board 140. A height of the coupling protrusion 124 (a height according to a direction Z) may be selected so as to not protrude from the surface of the first plate 142*a* (e.g., the lower surface of the first plate 142*a* based on FIG. 13) in the state that the coupling protrusion 124 is fitted and coupled into the fitting groove 1422*a*. In an implementation, the coupling protrusion 124 may be at the center of one edge of the contact opening 122, corresponding to or aligned with the position of the fitting groove 1422*a*.

Figure 10:
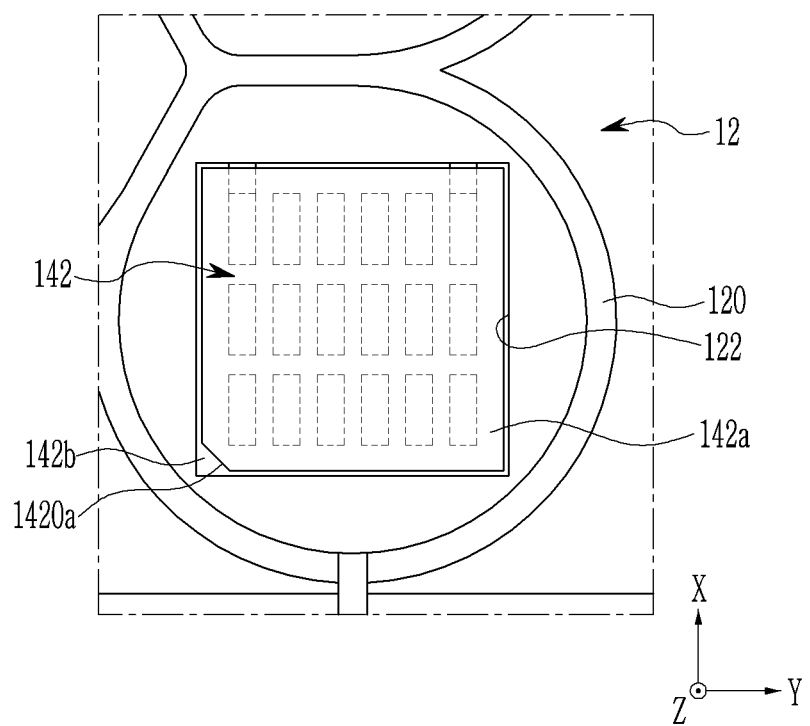
FIG. 10 is a view of a coupling relationship of a thermoelectric element assembly and a housing according to another embodiment.

The reverse insertion preventing structure of the thermoelectric element 142, as shown in FIG. 10, is also possible to cut at least one corner 1420*a* of the first plate 142*a* of the thermoelectric element 142 obliquely differently from the other corners angularly formed at an angle of approximately 90 degrees.

Figure 11:
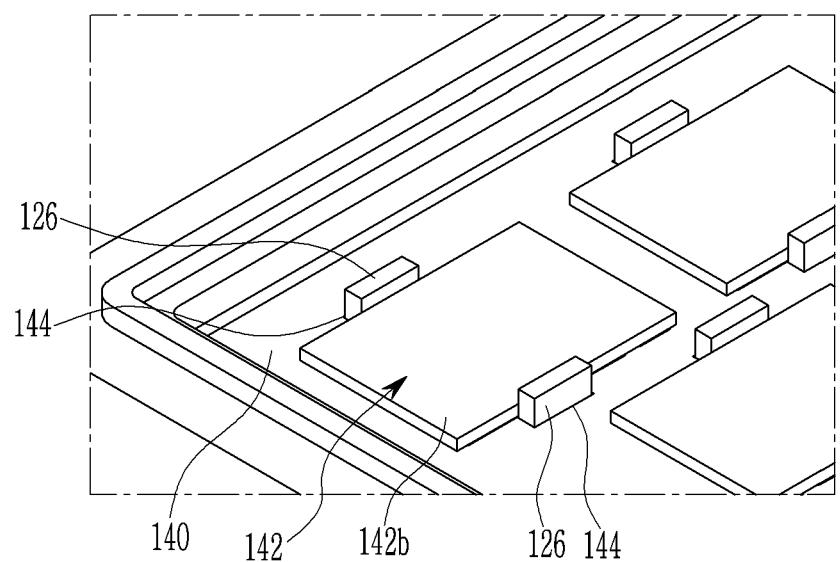
FIG. 11 is a partial perspective view of a state in which a stopper is coupled to a thermoelectric element assembly according to an embodiment.

In an implementation, when the thermoelectric element 142 is inserted into the contact opening 122, a stopper 126 (on or in the housing 12) may be inserted into the insertion groove 144 in the printed circuit board 140. The stopper 126 may include at least one rib protruding from the outer surface of the housing 12 around or at an edge of the contact opening 122. In an implementation, the rib may include two ribs arranged opposite to each other along the length direction of the contact opening 122. In an implementation, the insertion groove 144 may be on the printed circuit board 140 so as to be arranged opposite to each other along the length direction of the installation opening 140*a*. FIG. 11 shows a state in which two ribs of the stopper 126 are inserted into the insertion grooves 144 and protrude from the printed circuit board 140 when the thermoelectric element assembly 14 is mounted on the outer part of the bottom part 12*a* of the housing 12. Accordingly, movement of the thermoelectric element assembly 14, e.g., the printed circuit board 140, may be prevented due to the stopper 126, so that even if the thermoelectric element assembly 14 were to receive an external impact, the impact energy may be prevented from being directly transmitted to the thermoelectric element 142.

In an implementation, on the thermoelectric element assembly 14 mounted on the housing 12, a buffer member 16 for protecting the thermoelectric element 142 may be included. In an implementation, the buffer member 16 may be formed of a thermal pad on each thermoelectric element 142 of the thermoelectric element assembly 14. The thermal pad may help protect the thermoelectric element 142 from an external impact with its own elastic force. In an implementation, the thermal pad may be made of a heat transfer pad including a combination of silicon and a thermally conductive material. In an implementation, the buffer member may include not only the thermal pad, but also a polymer resin having a porous structure (e.g., polyethylene, polypropylene, polybutylene, polystyrene, rubber, or the like).

In an implementation, a heat sink 18 may be further included on the housing 12 to or at one side of the buffer member 16. Along with the heat sink 18, the thermal pad may facilitate the heat generated from secondary battery 10 to be dissipated to the outside of the battery module 1.

Figure 12:
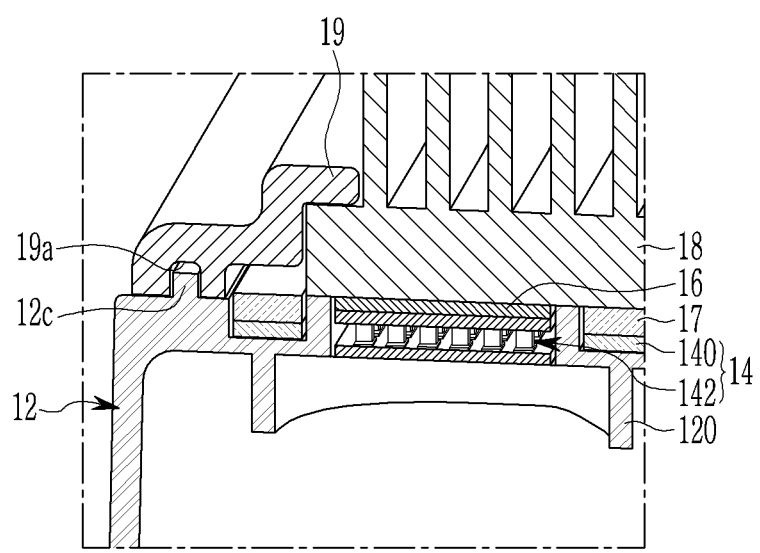
FIG. 12 is a partially cut-away perspective view of a state in which a coupling case is fixed to a housing in a battery module according to an embodiment.

In the state that the heat sink 18 is mounted on the housing 12 with the buffer member 16, a coupling case 19 may be coupled to the housing 12. The coupling case 19 may have a shape of an approximately square frame, and an inner rim thereof may be closely attached to a rim of the heat sink 18 to be supported thereon, and an outer rim thereof may be coupled with a coupling structure by fitting a circumference groove 19a on a lower surface thereof to a circumference protrusion 12c on the housing 12 (referring to FIG. 12). This coupling structure may be fixed through plastic laser welding or the like so that the thermoelectric element assembly 14, the buffer member 16, and the heat sink 18 may be fixed to the housing 12 in a stable state. An insulation material 17 (referring to FIG. 12) on the thermoelectric element assembly 14 may help prevent heat generated from the contact surface side of the heat sink 18 (which is in contact with the heat dissipation side of the thermoelectric element 142) from affecting the secondary battery side. In an implementation, the insulation material may be omitted. In an implementation, the insulating role of this insulating material may be performed by an air layer.

Figure 13:
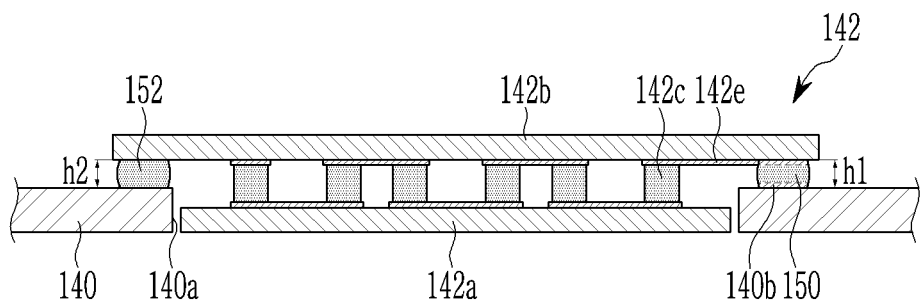
FIG. 13 is a partial cross-sectional view taken along a line VIII-VIII of FIG. 5.

FIG. 13 is a partial cross-sectional view taken along a line VIII-VIII of FIG. 5. As described above, a terminal or outermost semiconductor (e.g., a P-type semiconductor, 142c) electrically connected to the semiconductor terminal 142e may be electrically connected to the terminal 140b of the printed circuit board through an electrical connector or solder 150. In an implementation, as illustrated in FIG. 13, the semiconductor terminal 142e connected to the P-type semiconductor 142c may be connected to the terminal 140b of the printed circuit board by the solder 150, or the semiconductor terminal connected to an N-type semiconductor may also be connected to the terminal of the printed circuit board by the solder in the same way. In an implementation, the solder 150 between and electrically connecting the semiconductor terminal 142e and the terminal 140b of the printed circuit board may be an electrical connection of the thermoelectric element 142 to the printed circuit board 140. The solder 150 may be at one side of the thermoelectric element 142, and the solder 150 may not be on the other side (facing the one side), and the thermoelectric element 142 could be tilted to one side due to the height h1 of the solder 150.

To help prevent such tilting, between the second plate 142b of the thermoelectric element 142 and the printed circuit board 140, a dummy pattern 152 (e.g., that is not electrically connected to any other components) corresponding to the height h1 of the solder 150, e.g., having a height h2 that is same as or substantially equal to the height h1, may face (e.g., may be aligned opposite to) the solder 150. In an implementation, the dummy pattern 152 may be formed of the same material as the solder 150. The height h2 of the dummy pattern 152 may be 0.05 mm to 0.25 mm, e.g., 0.05 mm to 0.15 mm.

In an implementation, when the dummy pattern 152 is provided opposite to or facing the solder 150 and between the thermoelectric element 142 and the printed circuit board 140, the thermoelectric element 142 may maintain a good, flat state without tilting to either side, and the mechanical strength of the thermoelectric element assembly 14 may be enhanced. In an implementation, the dummy pattern 152 may be on all thermoelectric elements 142 of the thermoelectric element assembly 14.

Figure 14:
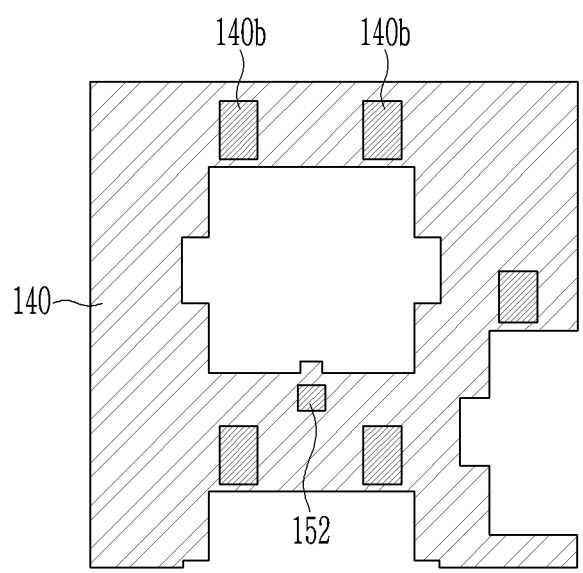
FIG. 14 is a view of a position of a dummy pattern according to an embodiment.
Figure 15:
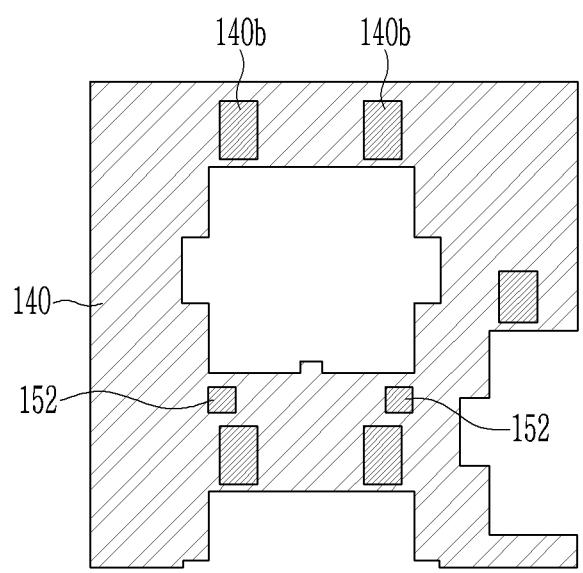
FIG. 15 is a view of a position of a dummy pattern according to another embodiment.

FIG. 14 and FIG. 15 are views of a position of a dummy pattern 152 according to an embodiment. For convenience of explanation, FIG. 14 and FIG. 15 show only the printed circuit board 140 without the thermoelectric element 142. In an implementation, the terminal 140b may be adjacent to both ends of one edge of the installation opening 140a of the printed circuit board 140, and the dummy pattern 152 may be adjacent to the center (referring to FIG. 14) or both ends (referring to FIG. 15) of the other edge (facing the upper one side) of the installation opening 140a. In an implementation, the thermoelectric element 142 may be coupled to the installation opening 140a of the printed circuit board 140 and may be electrically connected to the printed circuit board 140. In an implementation, the dummy pattern 152 may substantially consist of the solder on the printed circuit board 140 or the solder on the second plate 142b of the thermoelectric element 142, which may be appropriately selected according to the manufacturing condition of the thermoelectric element assembly 14.

In an implementation, after the thermoelectric element assembly 14, the buffer member 16, and the heat sink 18 are fixed to the housing 12 as described above, a plurality of secondary batteries 10 may be disposed in the inner accommodating space of the housing 12 to be connected to the thermoelectric element assembly 14, thereby manufacturing the battery module 1. In an implementation, each secondary battery 10 may be disposed in the inner accommodating space of the housing 12 so that the bottom part of the can 100 is inserted into the inner space formed by the corresponding supporting jaw 120 as described above. In an implementation, the first plate 142a of each thermoelectric element 142 of the thermoelectric element assembly 14 may be exposed to the inner space formed by the supporting jaw 120 through the contact opening 122, and the bottom part of the can 100 of the secondary battery 10 may be in contact with the first plate 142a. In an implementation, the plurality of secondary batteries 10 may be in contact in a one-to-one relationship with the plurality of thermoelectric elements 142 of the thermoelectric element assembly 14, e.g., forming a plurality of pairs.

In an implementation, when the thermoelectric element 142 of the thermoelectric element assembly 14 individually contacts a secondary battery 10 in the housing 12, independent temperature control for the plurality of secondary batteries 10 may be achieved.

In an implementation, if the secondary batteries 10 of the battery module 1 in an electric vehicle are rapidly charged, or a temperature of the outside air around battery module 1 is high, the temperature of a secondary battery 10 at or near the center of the housing 12 may be higher than a temperature of a secondary battery 10 at an outer part (e.g., edge) of the housing 12. In an implementation, the first plate 142a of the thermoelectric element 142 may be cooled by current applied from the battery management system, thereby acting as a heat absorber.

In an implementation, it is possible to individually drive the thermoelectric elements 142, which may be in individual contact with each secondary battery 10 in a one-to-one correspondence, and it is possible to cool only the secondary batteries 10 at or near the center of the housing 12, or increase the cooling degree of the secondary battery 10 at the center, rather than the secondary batteries 10 at the outer portion of the housing 12. In an implementation, it is possible to precisely manage the temperature of the secondary batteries while minimizing a temperature deviation for each position of a plurality of secondary batteries 10 in the housing 12.

In an implementation, when charging the secondary batteries 10 while the battery module 1 is in a low temperature environment (e.g., less than 0° C.), if a flow direction of the current applied from the battery management system to the thermoelectric element assembly 14 is reversed from the above cooling case, the first plate 142a of the thermoelectric elements 142 contacting the secondary batteries 10 may be heated, thereby acting as a heater. In an implementation, the secondary batteries 10 may be heated, e.g., the secondary batteries 10 at the center and the outer portion of the housing 12 may be individually heated, and a temperature deviation may be minimized, even when the heating of the secondary batteries 10 is required.

In an implementation, the temperature control for the plurality of secondary batteries 10 accommodated in the housing 12 may be individually (independently) performed using the thermoelectric elements 142 of the corresponding thermoelectric element assembly 14, so that a configuration of another secondary battery thermal management system using a refrigerant (e.g., cooling water) may be omitted or reduced.

Figure 16:
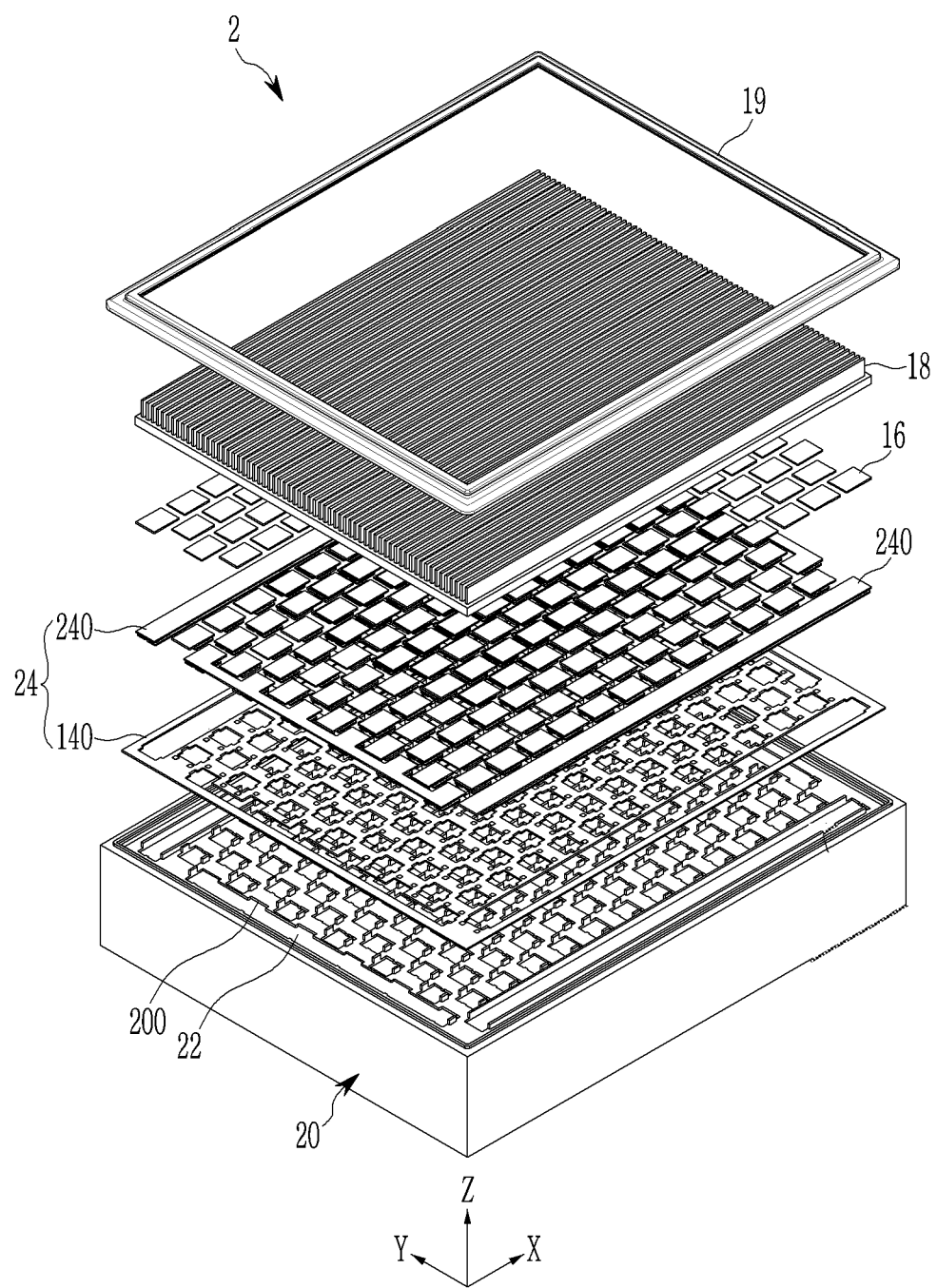
FIG. 16 is an exploded perspective view of a battery module according to another embodiment.

FIG. 16 is an exploded perspective view of a battery module according to another embodiment. The battery module 2 according to the present embodiment has substantially the same configuration as the above-described battery module, and only other configurations, e.g., differences, will be described below.

The battery module 2 according to the present embodiment may have a different contact structure between the secondary batteries 22 at the outer portion of the housing 20 and the thermoelectric element 240 of the thermoelectric element assembly 24, compared to the battery module described above.

In an implementation, the secondary batteries 22 at the outer part of the housing 20 may not contact the thermoelectric elements 240 in a one-to-one correspondence, and at least two secondary batteries 22 may be in contact with one thermoelectric element 240, e.g., as a pair. In an implementation, the contact opening 200 at the outer part of the housing 20 may include only one opening so that the secondary batteries 22 in a line (e.g., row or column) at the outer part of the housing 20 may all be exposed in one opened space, and the thermoelectric element 240 on the outer contact opening 200 may also be formed of or as a single thermoelectric element. In an implementation, as illustrated in FIG. 16, four thermoelectric elements 240 may be along the outer part of the housing 20 in the battery module 2, e.g., as the housing 20 may be a quadrangular box.

The secondary batteries in a portion or area other than the outer portion of the housing 20 may be in contact with the thermoelectric elements of the thermoelectric element assembly 24 in a one-to-one manner, as in the above-described embodiment.

In the battery module 2 according to the present embodiment, the heating or cooling of the secondary batteries 22 by the thermoelectric element assembly 24 may be performed in the same manner as the battery module of the above-described embodiment. At least two secondary batteries 22 at the outer part of housing 20 may be collectively heated or cooled through one thermoelectric element 240, and the temperature control for each position of secondary battery 22 may be further simplified according to the present embodiment.

By way of summation and review, for safe and efficient operation of battery modules in various environments, an increase in temperature in a high temperature environment and a decrease in temperature in a low temperature environment may be suppressed.

One or more embodiments may provide a battery module capable of precisely controlling a temperature of a plurality of secondary batteries.

One or more embodiments may provide a battery module capable of efficiently realizing temperature control of a plurality of secondary batteries by an improved structure.

In an embodiment, the temperature control for a plurality of secondary batteries may be individually performed in the battery module to help improve the efficiency of the temperature control for the entire battery module.

Moreover, in the thermoelectric element assembly that implements the temperature control of the secondary battery, the thermoelectric element with improved flatness may help prevent quality deterioration of the thermoelectric element assembly and may help enhance mechanical rigidity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery module, comprising:
   a housing accommodating a plurality of secondary batteries; and
   a thermoelectric element assembly on the housing and in contact with the plurality of secondary batteries through at least one contact opening in the housing, the thermoelectric element assembly being configured to heat or cool the plurality of secondary batteries.

2. The battery module as claimed in claim 1, wherein:
   the at least one contact opening includes a plurality of contact openings in the housing, and
   the thermoelectric element assembly is respectively in contact with the plurality of secondary batteries through the plurality of contact openings.

3. The battery module as claimed in claim 2, wherein the thermoelectric element assembly includes:
   a printed circuit board on the housing and including a plurality of installation openings aligned with the plurality of contact openings; and
   a plurality of thermoelectric elements respectively in the plurality of installation openings and electrically connected to the printed circuit board.

4. The battery module as claimed in claim 3, wherein the plurality of thermoelectric elements are in contact in a one-to-one correspondence with the plurality of secondary batteries.

5. The battery module as claimed in claim 3, wherein:
one thermoelectric element of the plurality of thermoelectric elements along an edge of the housing is in contact with at least two secondary batteries of the plurality of secondary batteries, and
other thermoelectric elements of the plurality of thermoelectric elements are in contact with other secondary batteries of the plurality of secondary batteries in a one-to-one correspondence.

6. The battery module as claimed in claim 3, wherein the housing further includes a stopper adjacent to the plurality of thermoelectric elements, the stopper being configured to prevent movement of the printed circuit board.

7. The battery module as claimed in claim 6, wherein:
the printed circuit board further includes an insertion groove, and
the stopper includes at least one rib protruding from a surface of the housing and into the insertion groove of the printed circuit board.

8. The battery module as claimed in claim 3, wherein each thermoelectric element of the plurality of thermoelectric elements includes:
an electrically conductive first plate in contact with one secondary battery of the plurality of secondary batteries;
an electrically conductive second plate having a larger area than that of each contact opening and spaced apart from the first plate; and
a semiconductor between the first plate and the second plate and electrically connected to the first plate and the second plate.

9. The battery module as claimed in claim 8, wherein:
the first plate further includes a fitting groove,
the housing further includes a coupling protrusion, and
the coupling protrusion fits into and is coupled with the fitting groove.

10. The battery module as claimed in claim 3, further comprising at least one dummy pattern between the printed circuit board and each thermoelectric element of the plurality of thermoelectric elements, the at least one dummy pattern having a height corresponding to a height of an electrical connector between the thermoelectric element and the printed circuit board.

11. The battery module as claimed in claim 10, wherein:
each thermoelectric element of the plurality of thermoelectric elements includes:
an electrically conductive first plate in contact with one secondary battery of the plurality of secondary batteries;
an electrically conductive second plate with a larger area than that of each contact opening and spaced apart from the first plate;
a plurality of semiconductors between the first plate and the second plate and electrically connected to the first plate and the second plate; and
a semiconductor terminal on the second plate, extending from an outermost semiconductor among the plurality of semiconductors, and electrically connected to a terminal of the printed circuit board, and
the at least one dummy pattern faces the electrical connector between the second plate and the printed circuit board.

12. The battery module as claimed in claim 11, wherein the at least one dummy pattern includes a plurality of dummy patterns.

13. The battery module as claimed in claim 11, wherein a height of the at least one dummy pattern between the thermoelectric element and the printed circuit board is about the same as the height of the electrical connector between the terminal of the printed circuit board and the semiconductor terminal of the thermoelectric element.

14. The battery module as claimed in claim 11, wherein:
each installation opening of the plurality of installation openings has a rectangular shape,
the electrical connector between the thermoelectric element and the printed circuit board is adjacent to both ends of one edge of the installation opening, and
the at least one dummy pattern is adjacent to a center of another edge facing one side of the installation opening.

15. The battery module as claimed in claim 11, wherein:
each installation opening of the plurality of installation openings has a rectangular shape,
the electrical connector between the thermoelectric element and the printed circuit board is adjacent to both ends of one edge of the installation opening, and
the at least one dummy pattern is adjacent to both ends of another edge facing one side of the installation opening.

16. The battery module as claimed in claim 11, wherein:
the first plate further includes a fitting groove,
the housing further includes a coupling protrusion, and
the coupling protrusion fits into and is coupled with the fitting groove.

17. The battery module as claimed in claim 16, wherein:
the contact openings and the first plate each have a rectangular shape, and
the coupling protrusion and the fitting groove are each at a center of one edge of each contact opening and one edge of the first plate.

18. The battery module as claimed in claim 11, wherein:
the contact openings and the first plate each have a rectangular shape, and
at least one corner of the first plate has a different shape than other corners of the first plate.

19. The battery module as claimed in claim 18, wherein the at least one corner of the first plate has an obliquely cut shape.

20. The battery module as claimed in claim 10, wherein the height of the at least one dummy pattern is 0.05 mm to 0.25 mm.

21. The battery module as claimed in claim 10, wherein the at least one dummy pattern is formed by soldering.

22. The battery module as claimed in claim 1, further comprising a buffer member on one side of the thermoelectric element assembly, the buffer member being configured to protect the thermoelectric element assembly.

23. The battery module as claimed in claim 22, wherein the buffer member includes a thermal pad on the thermoelectric element assembly corresponding to each secondary battery of the plurality of secondary batteries.

24. The battery module as claimed in claim 23, further comprising a heat sink on the housing at one side of the buffer member.

25. The battery module as claimed in claim 24, further comprising a coupling case on the heat sink and fixed to the housing.

26. The battery module as claimed in claim 1, wherein:
each secondary battery of the plurality of secondary batteries includes:
- a can in which an electrode assembly is accommodated, and
- a cap assembly coupled to an opening of the can, and the thermoelectric element assembly is in contact with a bottom of the can of each secondary battery of the plurality of secondary batteries.

27. The battery module as claimed in claim 26, wherein each secondary battery of the plurality of secondary batteries is cylindrical.

28. A vehicle comprising the battery module as claimed in claim 1.

29. A battery module, comprising:
- a housing accommodating a plurality of secondary batteries; and
- a thermoelectric element assembly on the housing, the thermoelectric element assembly being configured to heat or cool the plurality of secondary batteries at each position by being in contact with the plurality of secondary batteries through a contact opening in the housing.

30. A method of manufacturing a battery module, the method comprising:
- preparing a housing in which a plurality of contact openings are formed in a predetermined pattern on a bottom of the housing;
- preparing a thermoelectric element assembly in which a plurality of thermoelectric elements configured to heat or cool a secondary battery are arranged according to the predetermined pattern of the plurality of contact openings;
- mounting the thermoelectric element assembly in the housing such that the thermoelectric elements are in the contact openings; and
- disposing the secondary battery such that the thermoelectric elements are in contact with a surface of the secondary battery in an accommodating space of the housing.

* * * * *